United States Patent
Waldner (10) Patent No.: US 11,377,728 B2
(45) Date of Patent: Jul. 5, 2022

(54) BROADBAND OPTICAL MONITORING

(71) Applicant: Evatec AG, Trubbach (CH)

(72) Inventor: Stephan Waldner, Sargans (CH)

(73) Assignee: EVATEC AG, Trubbach (CH)

(*) Notice: Subject to any disclaimer, the term of this patent is extended or adjusted under 35 U.S.C. 154(b) by 701 days.

(21) Appl. No.: 16/316,680

(22) PCT Filed: Jul. 10, 2017

(86) PCT No.: PCT/EP2017/067293
§ 371 (c)(1),
(2) Date: Jan. 10, 2019

(87) PCT Pub. No.: WO2018/011151
PCT Pub. Date: Jan. 18, 2018

(65) Prior Publication Data
US 2020/0181763 A1 Jun. 11, 2020

(30) Foreign Application Priority Data

Jul. 13, 2016 (CH) ..................... 00890/16

(51) Int. Cl.
*C23C 14/54* (2006.01)
*C23C 16/52* (2006.01)
(Continued)

(52) U.S. Cl.
CPC ............ *C23C 14/547* (2013.01); *C23C 16/52* (2013.01); *G01B 11/0633* (2013.01); *G01B 11/0683* (2013.01)

(58) Field of Classification Search
CPC . C23C 14/24–32; C23C 14/547; C23C 16/52; G01B 11/0683; G02B 11/0633; G02B 11/0683
(Continued)

(56) References Cited

U.S. PATENT DOCUMENTS 4,832,490 A    5/1989  Boos
5,425,964 A *  6/1995  Southwell ............... E05D 1/204
                                                              427/10
(Continued)

FOREIGN PATENT DOCUMENTS

CN       101514888 A    8/2009
EP       0 257 229 A2   3/1988
(Continued)

OTHER PUBLICATIONS

International Search Report for PCT/EP2017/067293 dated Oct. 11, 2017.
Written Opinion for PCT/EP2017/067293 dated Oct. 11, 2017.

*Primary Examiner* — Elizabeth A Burkhart
(74) *Attorney, Agent, or Firm* — Pearne & Gordon LLP (57) ABSTRACT

A method of in situ monitoring a thin film deposition process on a substrate, the method including a) defining a desired spectrum, the desired spectrum being a transmission or a reflection spectrum; b1) illuminating the substrate by means of a light source emitting light within the desired spectrum, b2) receiving light reflected from the substrate or transmitted through the substrate, b3) determining a transmission or a reflection spectrum out of the received light; c) defining a spectrum or a combination of spectra in dependency of the spectrum determined in step b3) to be a current spectrum; d) determining a weight spectrum as a function of the current spectrum; e) calculating a real number as a function of the current spectrum, of the desired spectrum and of the weight spectrum; f) exploiting the real number as indication for a deviation of the current spectrum from the desired spectrum.

11 Claims, 4 Drawing Sheets

(51) Int. Cl.
  *G02B 11/06* (2006.01)
  *G01B 11/06* (2006.01)
(58) Field of Classification Search
  USPC .......................................................... 427/10
  See application file for complete search history.

(56) References Cited

U.S. PATENT DOCUMENTS

| | | | |
|---|---|---|---|
| 8,379,228 B1 | 2/2013 | Streater | |
| 2004/0018653 A1* | 1/2004 | Johnson | ................ H01L 21/67 |
| | | | 438/16 |
| 2008/0285060 A1* | 11/2008 | Zoller | ................... C23C 14/547 |
| | | | 356/630 |
| 2015/0203966 A1* | 7/2015 | Budiarto | ............. G01E 11/0625 |
| | | | 427/10 |

FOREIGN PATENT DOCUMENTS

| | | |
|---|---|---|
| WO | 2010/106533 A2 | 9/2010 |
| WO | 2015/099671 A1 | 7/2015 |

\* cited by examiner

BROADBAND OPTICAL MONITORING

The invention addressed herein relates to a method of in situ monitoring a thin film deposition process on a substrate. Under further aspects, the invention relates to a method of controlling a thin film deposition process and to a method of controlling a production of a multi-layer thin film.

More specifically, this invention is related to optical monitoring a thin film deposition process making use of an optical monitoring apparatus with a light source that illuminates a substrate during the thin film deposition and a device to measure the light reflected from or transmitted through the substrate. For monochromatic optical monitoring, the transmission or reflection of only one wavelength is analyzed in order to monitor the growth of a layer during a deposition process. This may not be sufficient to monitor the deposition process in the production of precision optical coatings used as broadband reflectors or filters, such as distributed Bragg reflectors, narrow bandpass filters, wide bandpass filters, or multi-bandpass filters. For the production of optical coatings that need to have given reflection or transmission properties defined over an extended range of wavelengths it is known to apply broadband optical monitoring. For this purpose, a broadband light source is arranged to send light into the deposition chamber, e.g. as a collimated light beam that passes through the substrate and exits the chamber into an optical receiver. There, the light is brought to a spectrometer with an array detector, which measures the spectral distribution of the intensity. Taking into account a previously recorded calibration spectrum, the current transmittance spectrum is determined. Alternatively, the light is reflected from the substrate and the current reflectance spectrum is determined. The reflectance spectrum, too, may be determined taking into account a previously recorded calibration spectrum. During the build-up of a thin film, the transmittance spectrum or the reflectance spectrum is continuously changing depending on the thickness of the layer being deposited.

Here we use the term spectrum for any quantity that is a function of the wavelength. The spectrum may e.g. be pointwise defined for a list of wavelengths $\lambda_i$, i being an index.

One problem for optical monitoring is that—besides the optical monitoring light—there may be other strong light sources present in the deposition chamber, such as e.g. e-beam sources, sputter sources, plasma/ion sources, or heaters. The light from these sources may be very intense at specific wavelengths. The light from these sources may also vary with time. If such disturbing light enters the optical receiver, it distorts the current transmittance or reflectance spectrum. The monitoring of the deposition process is thus disturbed and e.g. an accurate determination of the correct moment to stop the deposition of the current layer may be missed.

In the patent EP 0 257 229 B1 an optical monitoring method is disclosed that uses periodic measurement of the disturbing light without the optical monitoring light ("background measurement") and subsequent subtraction of the background measurement from the measurement signal. This method, however, is limited to relatively slowly changing disturbing light and it requires means to interrupt the light beam (e.g. a chopper) and additional processing steps to be applied to the measured signal.

Furthermore, the light source itself may have spectral characteristics that vary over time. Such a variation cannot be observed in the background measurement, but may hinder a proper interpretation of the spectrum.

The object of the present invention is to provide an alternative method of in situ monitoring a thin film deposition process on a substrate.

This object is achieved by the method according to claim 1.

The method according to the invention is a method of in situ monitoring a thin film deposition process on a substrate. The method comprises the steps of
  a) defining a desired spectrum, the desired spectrum being a transmission or a reflection spectrum defined in a range of wavelengths;
  b) at least once:
    b1) illuminating the substrate by means of a light source emitting light at least within the range of wavelengths,
    b2) receiving light reflected from the substrate or transmitted through the substrate,
    b3) determining at least one of at least one of a transmission and of a reflection spectrum out of the received light within the range of wavelengths;
  c) defining a spectrum or a combination of spectra in dependency of the at least one spectrum determined in step b3) to be a current spectrum;
  d) determining a weight spectrum as a function of at least the current spectrum;
  e) calculating a real number as a function of the current spectrum, of the desired spectrum and of the weight spectrum
  f) exploiting the real number as indication for a deviation of the current spectrum from the desired spectrum.

By applying a weight spectrum, the method according to the invention is able to discriminate regions in the range of wavelengths that give a reliable information about the deviation of the current spectrum and the desired spectrum from other regions in the range of wavelengths that show disturbances. We consider effects on the spectrum that have an origin different from the optical properties of the thin film to be monitored as disturbances. Regions in the range of wavelengths showing disturbances thus can be given a lower weight by applying an appropriate weight spectrum. The disturbances mentioned may originate from various light sources in the thin film deposition system or from detector noise. Thus, the method according to the present invention provides a method of broadband optical monitoring a thin film deposition process on a substrate, the method having low susceptibility to time dependent disturbances from various light sources.

The weight spectrum is defined taking into account the current spectrum, thus the weight function can be adapted in real time to a changing illumination situation, as it is updated with information acquired with the current spectrum. According to the invention, the weight function is dynamically calculated, thus allowing the method to adapt itself to different processes and dynamically changing illumination situations. In addition to the current spectrum, e.g. the desired spectrum, a predefined initial weight spectrum or a previously used weight spectrum may be taken into account, when defining the weight spectrum.

The step of determining a transmission or reflection spectrum of the received light may involve the determination of a percentage of transmittance or a percentage of reflectance taking into account a previously recorded calibration spectrum. Several spectra in different wavelength regions, e.g. overlapping wavelength regions, may be acquired and combined into one spectrum covering a larger wavelength region.

Calculation of the real number may be carried out by calculating the absolute value of a spectral difference of the current spectrum and the desired spectrum, multiplying the result by the weight spectrum and building the sum or integral over the range of wavelength.

According to the method, real number is exploited as indication for a deviation of the current spectrum from the desired spectrum, which therefore could be seen as 'target spectrum'. The step of exploiting the real number as indication for a deviation of the current spectrum from the desired spectrum makes possible to apply the method according to the invention in closed-loop control for layer deposition processes. The method according to the invention allows broadband optical monitoring over a wide spectral range, e.g. over wavelengths from 380 nm to 1000 nm, and at the same time keeping noise in the produced monitoring signal, i.e. the real number, low, due to its algorithm applying "dynamic noise suppression".

The method has the further advantage that flexibility in the design of arrangements for thin film deposition and optical monitoring is increased. When applying the method according to the invention, a requirement for separating an optical monitoring path from possible paths of disturbing light is significantly relaxed, thus making new designs of thin film deposition chambers possible. The application of the method according to the invention further increases the freedom to select process parameters. Process parameters that would not be allowable with known monitoring methods, because they produce too much disturbing light, become eligible when applying the method according to the invention. Examples for such process parameters are the application of higher power, heating during film deposition or the use of alternative coating materials.

In one embodiment of the method according to the invention, which may be combined with any of the embodiments still to be addressed unless in contradiction, step b) is repeated at least twice to measure at least a previous spectrum and the current spectrum and wherein in step d)
- a signal spectrum and a noise spectrum are calculated as a function of the at least one previous spectrum and the current spectrum, and
- the weight spectrum is calculated as a function of the signal spectrum and the noise spectrum, in particular as ratio of the signal spectrum and the noise spectrum.

The signal spectrum reflects the slowly changing part of the spectra. It may e.g. be calculated as a mean spectrum over several spectra of the same type. Moving average calculation may be applied to the values of the spectra at every wavelength separately.

The noise spectrum reflects the temporal instability of the spectra or the fast changing part of the spectra. It may e.g. be calculated as the pointwise standard deviation or the pointwise difference between maximum and the minimum value over several spectra.

The weight spectrum may be calculated such that the weight is high for wavelength's, where the signal spectrum has large intensity, and the weight is low, where the signal spectrum has low intensity. This way, the resulting real number playing the role of a numerical criterion is only weakly influenced by accidental small variations of a disturbing light. The weight spectrum may be calculated such that the weight is high for wavelength's, where the noise spectrum has low intensity. This way, regions in the spectrum with little disturbances have a large contribution to the real number being used as a numerical criterion. The weight spectrum may be calculated such that the weight is low for wavelength's, where the noise spectrum has high intensity. This way, regions of the spectrum showing large temporal instability, are suppressed in their influence on the real number being used as a numerical criterion. A large number of mathematical functions are conceivable to combine the signal spectrum and the noise spectrum to a weight spectrum showing at least some of the above listed conditions. A simple way to fulfill the above listed conditions is to use the ratio of the signal spectrum and the noise spectrum as the weight spectrum. A constant may be added to the noise spectrum before taking the ratio in order to avoid division by zero or very small values.

A larger number of previous spectra may be evaluated to determine the noise spectrum and the signal spectrum, such as e.g. the last 5 to 20 spectra before the current spectrum.

By applying this embodiment of the method a wavelength range that extends into a region with low signal level can be safely included into the wavelength range for monitoring a thin film deposition process, as its influence onto the real number being used as a numerical criterion is limited where the signal-to-noise ratio is low. Thus, e.g. with a halogen light source, wavelengths below 390 nm may be included into the monitoring wavelength range without adverse effects on the stability of the monitoring signal.

In one embodiment of the method according to the invention, which may be combined with any of the preaddressed embodiments and any of the embodiments still to be addressed unless in contradiction, the real number K is calculated as $$K = \sum_i W(\lambda_i) \cdot (|C(\lambda_i) - T(\lambda_i)|)^n$$

wherein C is said current spectrum, T is said desired spectrum, W is said weight spectrum, $\lambda_i$ are the wavelength's at which the spectra are defined and n is a number, in particular n=1 or n=2.

According to this embodiment, the calculation of the real number being used as a numerical criterion is carried out by calculating the absolute value of a spectral difference of the current spectrum and the desired spectrum, raising the spectral difference to power n, multiplying the result by the weight spectrum and building the sum or integral over the range of wavelength. This way, a numerical criterion results that will have a value of zero if the current spectrum and the desired spectrum match perfectly. The real number being used as a numerical criterion will have large values for large deviations between the current spectrum and the desired spectrum. By taking the spectral difference to a higher power n>1, e.g. n=2, large local deviations result in an over proportional increase in the numerical criterion. Alternatively, the spectral difference may directly be multiplied by the weight spectrum without taking the spectral difference to a higher power, i.e. selecting n=1, such that the influence of a local deviation between the current spectrum and the desired spectrum at a certain wavelength only depends on the weight spectrum at this wavelength.

In one embodiment of the method according to the invention, which may be combined with any of the preaddressed embodiments and any of the embodiments still to be addressed unless in contradiction, the light source is a deuterium-halogen light source or a laser-driven light source.

This embodiment allows the application of high performance light sources that show unstable signals at certain wavelengths and therefore tend to produce an unstable monitoring signal when applied with conventional monitoring methods.

A deuterium-halogen light source shows instable signal at certain wavelengths, e.g. at the deuterium peaks at 486 nm and 656 nm. If used as light source in the method according to the invention, however, a stable monitoring signal can be derived from broadband spectra, thus making full use of the wide spectral range accessible by deuterium-halogen light sources.

Similarly, laser-driven light sources (LDLS) may show instable signals at certain wavelengths above 800 nm. If used as light source in the method according to the invention, a stable monitoring signal can be produced in spite of these instable signals. Thus, the method takes advantage of the attractive properties of a laser-driven light source, namely high brightness across a broad wavelength range and long lifetime of the light source.

Further in the scope of the invention lies a method of controlling a thin film deposition process on a substrate comprising the steps of starting a thin film deposition process;

in a succession of time steps, applying the method of in situ monitoring a thin film deposition process according to the invention for producing the real number for each time step thereby producing a sequence of numerical criteria;

terminating the thin film deposition process as soon as the sequence of numerical criteria fulfills a predefined condition.

This method allows accurately determining the moment of termination of the thin film deposition process of a given layer. As the monitoring signal produced by the method of in situ monitoring a thin film deposition process according to the invention is very reliable, i.e. contains little noise or disturbances, the predefined condition will not be fulfilled accidentally and too early. The method prevents as well a situation, where a disturbance in the spectrum could prevent the achievement of the predefined condition at all, which would lead to a much too long deposition process and the substrate being wasted. The predefined condition may e.g. be that the last real number in the sequence has a value below a given limit. The predefined condition may as well be based on an evaluation of several numerical criteria in the sequence, in particular on an evaluation of the last few numerical criteria in the sequence. E.g. a polynomial may be fitted through the last few numerical criteria in the sequence and the predefined condition may be a condition applied to a derivative of the polynomial at the time corresponding to the last time step. As an example, the predefined criterion could be that the first derivative is positive at this time. The predefined criterion may in addition require that the thin film deposition process has already been running for a minimum number of time steps.

In one embodiment of the method according to the invention, which may be combined with any of the preaddressed embodiments and any of the embodiments still to be addressed unless in contradiction, the predefined condition is a transition of the sequence through a minimum.

With this embodiment of the method, the moment of closest approximation of the current spectrum to the desired spectrum can be detected very precisely. The fact that the transition through the minimum has already occurred when the transition is detected is no problem, as the desired spectrum may be calculated such that the desired spectrum is reached e.g. three time steps before the intended layer thickness is reached. In this case, the predefined condition for layer termination would be the existence of a transition through a minimum at the third last time step in the sequence. A transition through a minimum may be identified as a minimum value succeeded by a number, e.g. two, of increasing values for the real number being used as a numerical criterion. The detection of the transition through a minimum may be based on a polynomial fit through the last few real numbers in the sequence.

The invention is further directed to a method of controlling a production of a multi-layer thin film on a substrate comprising the steps of:

providing a desired spectrum for at least one layer of the multi-layer thin film;

applying the method of controlling a thin film deposition process according to the invention to control the film deposition process for the at least one layer and/or for deposition of subsequent layers.

This method ensures that the performance of the final multi-layer thin film is as close as possible to the original design. This method is suited to control the production of a multi-layer thin film on a substrate, whereby the complete multi-layer thin film needs to have predetermined optical properties. The method allows precisely stopping the deposition process for any intermediate layer stack.

The desired spectrum for the at least one layer may be calculated from a given a layer thickness and a layer composition defining a refractive index for each layer in the layer stack of the multi-layer thin film below and including the layer under discussion.

In one embodiment of the method, which may be combined with any of the preaddressed embodiments and any of the embodiments still to be addressed unless in contradiction, the method comprises the additional step of recalculating layer thicknesses and layer compositions for layers to be deposited on top of the layer, the recalculation being based on the current spectrum and/or on the value of the real number at the moment the layer is completed.

This embodiment of the method allows in-situ reoptimization, i.e. a correction of small deviations from the original design without interrupting the production process. This embodiment of the method may lead to significant yield improvements and cost reduction in the production of multi-layer thin films. Tighter tolerances in the final transmission or reflection spectra may be met with this method. Small variations in the deposition rate or the composition of the layer that lead to deviations observable in the current spectrum may be corrected by adjusting the remaining coating recipe to new required layer thicknesses and compositions in order to achieve the desired reflection or transmission spectrum for the final multi-layer thin film.

One embodiment of the method further comprises the step of calculating a desired spectrum for a layer stack comprising the layer and at least a further layer based on recalculated layer thicknesses and layer compositions.

This embodiment of the method has the advantage that a precise termination of the deposition of a reoptimized layer is possible. A desired spectrum is calculated for an adjusted or reoptimized layer stack to be produced after an intermediate layer stack that is completed with terminating the layer under discussion. This way, new layer thicknesses and layer compositions determined in the reoptimization process are taken into account when providing the desired spectrum.

The methods according to the invention, i.e. the method of in situ monitoring a thin film deposition process on a substrate, the method of controlling a thin film deposition process, as well as the method of controlling a production of a multi-layer thin film on a substrate, may be applied when operating an evaporator or a magnetron sputter tool.

The methods may as well be applied to ion plating, ion beam sputtering and atomic layer deposition. They are particularly useful in context of the production of optical thin films.

BRIEF DESCRIPTION OF THE DRAWINGS

The invention shall now be further exemplified with the help of figures. The figures show.

Figure 1:
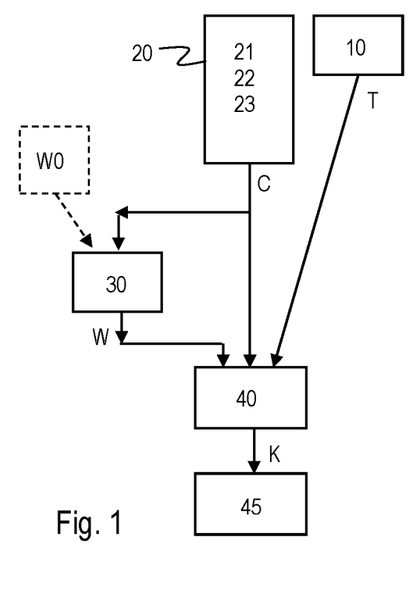
FIG. 1 a schematic flow chart of the method according to the invention.

FIG. 1 shows a schematic flow chart of the method of in situ monitoring a thin film deposition process on a substrate. There is a step of providing 10 a desired spectrum T. A spectrum is measured 20 in three steps, namely by illuminating 21 a substrate by means of a light source emitting light at least in a range of wavelengths, by receiving 22 light reflected from the substrate or transmitted through the substrate, and by determining 23 a transmission or a reflection spectrum of the received light over the range of wavelengths. The spectrum measured is defined to be the current spectrum C. The current spectrum C is used in two steps of the method. First, the current spectrum C is used in the step of calculating 40 a real number K. Second, a weight spectrum W is determined 30 by taking into account the current spectrum C. The calculation 40 of the real number K takes the current spectrum C, the desired spectrum T and the weight spectrum W as input and produces the real number K as output in function of the input. As last step 45 the real number K is exploited as indication for a deviation of the current spectrum C from the desired spectrum T. Thus, the real number K is a measure for a deviation of the current spectrum C from the desired spectrum T provided by the step 10, i.e. it is used as a numerical criterion. Optionally, the determining 30 of the weight spectrum W may, in addition to the current spectrum C, take into account an initial weight spectrum W0. Such an initial weight spectrum may be derived from properties of the light source in use, the desired spectrum, and/or from weight spectra determined during previous thin film deposition processes. The optional use of an initial weight spectrum W0 is indicated by a dashed box and a dashed arrow.

Figure 2:
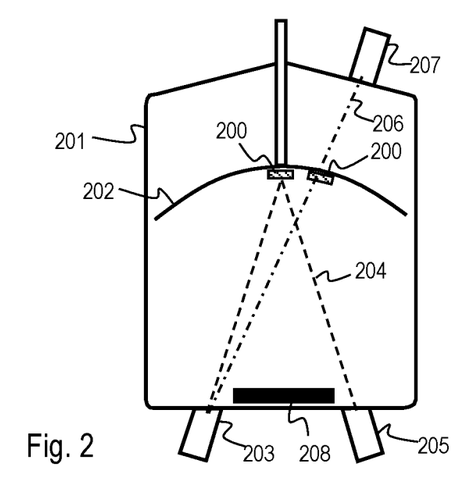
FIG. 2 a cross-section through an apparatus for a thin film deposition process.

FIG. 2 shows a cross-section through an apparatus for a thin film deposition process. The apparatus comprises means for performing the method of in situ monitoring a thin film deposition process on a substrate according to the invention. Substrates 200 are positioned in an evaporator chamber 201. A calotte 202 carries the substrates 200. An optical receiver 203 collects incoming light and analyzes the light by means of a spectrometer with an array-detector. Two possible types of light paths are shown. For a reflection measurement, light from an optical sender 205 follows the optical path 204 shown in dashed line. In this case, the light is reflected from the thin film on the substrate 200. For a transmission measurement, light from an optical sender 207 follows the optical path 206 shown in dash-dotted line. In this case, the light is transmitted through the substrate and the thin film on it. A light source may be incorporated into optical senders 205, 207. The spectrometer may be built into the optical receiver 203. Alternatively, optical senders 205, 207 and optical receiver 203 may be sender/receiver heads being connected, e.g. by optical fibers, to a light source and a spectrometer, respectively, the light source and the spectrometer being situated e.g. in a control cabinet. Evaporation sources 208, typically e-beam evaporation sources, are placed at the bottom of the evaporator chamber. These e-beam evaporation sources may produce light that at least indirectly may find its way into the optical receiver 203 and contribute to a measured spectrum. In other types of apparatus for thin film deposition, sources of disturbing light might as well be sputter sources, plasma/ion sources, or heaters.

Figure 3A:
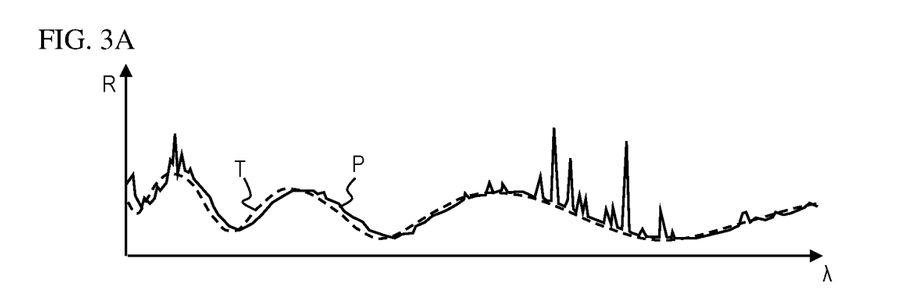
FIGS. 3A-3C examples of spectra and their interrelation.
Figure 3B:
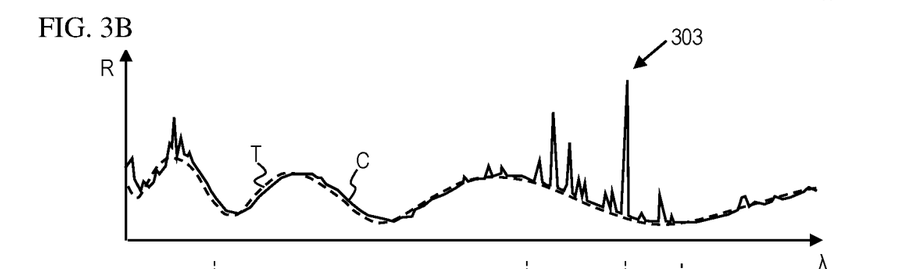

FIGS. 3A and 3B show examples of reflection spectra. Reflectance R is shown in dependence of wavelength λ. The spectra cover a wide spectral range, e.g. 380 nm to 1000 nm. In both figures the same desired spectrum T is shown as dashed line. In FIG. 3A a previous spectrum P is shown that was measured earlier during a deposition process. FIG. 3B shows a measured current spectrum C, which is only slightly different from the previous spectrum P. The measured spectra P and C displaying % reflection have been determined taking into account a previously recorded calibration spectrum. Generally, the current spectrum C is already a bit closer to the desired spectrum T, however, a peak 303 in the current spectrum C has significantly higher intensity as in the previous spectrum P. If one takes e.g. the area between the current spectrum C or the previous spectrum P, respectively, and the desired spectrum T as a measure of the deviation of the two spectra, the increase in the intensity of peak 303 would hide a part of the approach towards the desired spectrum that took place from the previous to the current spectrum. Peak 303 is a typical disturbance from a light source that varies over time.

Figure 3C:
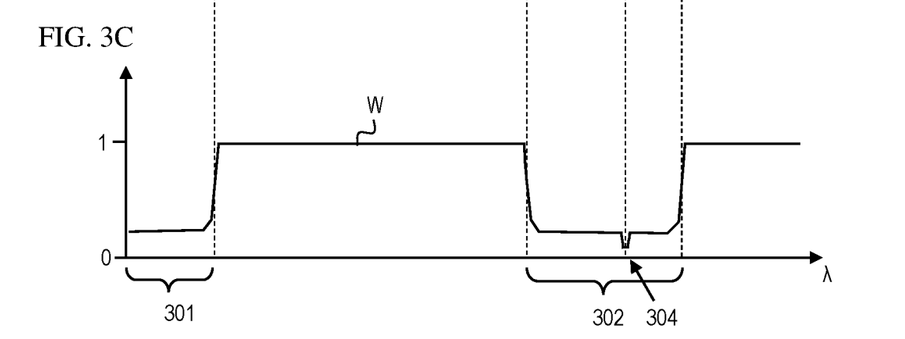

FIG. 3C shows schematically a possible weight spectrum W. Two regions 301 and 302 in the wavelength range are affected by disturbing light. In these regions the weight spectrum is reduced compared to the rest of the wavelength range. These regions of reduced weight correspond to the clusters of peaks in the measured spectra in FIG. 3A and FIG. 3B. The method according to the invention dynamically updates the weight function W. Such an update is the dip 304 in the weight spectrum, which locally reduces the weight to nearly zero. The dip 304 was introduced due to the fast change over time at the wavelength corresponding to the peak 303. This way, noise and fast fluctuations at this wavelength have nearly no influence on the real number K being used as a numerical criterion, the regions 301 and 302 have reduced influence on the real number K, whereas the region between 301 and 302 providing stable and reliable information contribute with large weight to the real number K.

Figure 4:
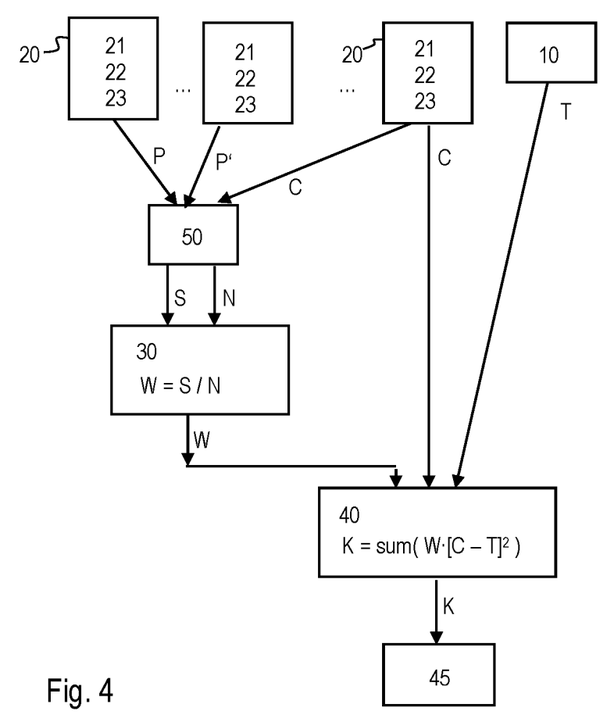
FIG. 4 a schematic flow chart of an embodiment of the method according to the invention.

FIG. 4 shows a schematic flow chart of an embodiment of the method. In this embodiment, the sequence of illuminating the substrate 21, receiving light 22 and determining a transmission or reflection spectrum 23 is performed several times resulting in previous spectra P, P' and in the last measured spectrum being defined to be the current spectrum C. In step 50 a signal spectrum S and a noise spectrum N are calculated as a function of the previous spectra P, P' and the current spectrum C. The step 30 of determining a weight spectrum W is carried out by defining the weight spectrum W to be the ratio of the signal spectrum S and the noise spectrum N. This weight spectrum W, together with the current spectrum C and the desired spectrum T provided in step 10 are input for the calculation 40 of the real number K. In this embodiment of the method, the real number K is calculated by multiplying the squared difference of the current spectrum C and the desired spectrum T with the weight spectrum W and summing the result over the wavelengths. As last step 45 the real number K as exploited as indication for a deviation of the current spectrum C from the desired spectrum T.

Figure 5:
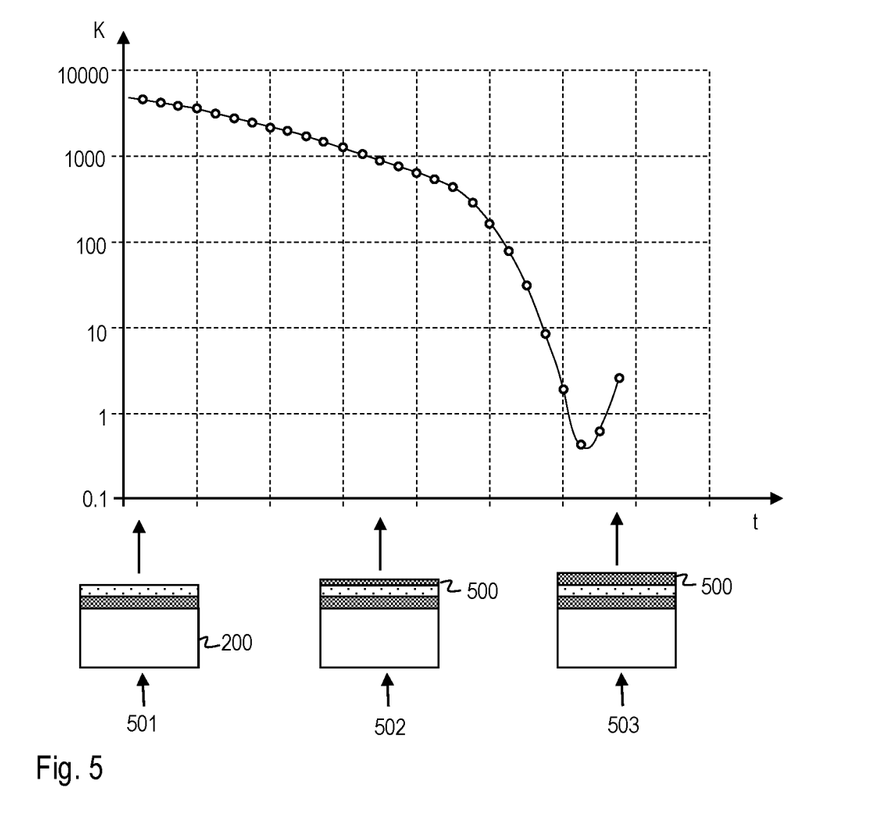
FIG. 5 a sequence of numerical criteria as produced by the method of controlling a thin film deposition process according to the invention.

FIG. 5 shows a sequence of numerical criteria as produced by the method of controlling a thin film deposition process according to the invention. Numerical criteria K have been determined by the method of monitoring a thin film deposition process on a substrate. As the values of the real number K being used as a numerical criterion change over several magnitudes, they are plotted on a logarithmic scale. The left end of the time axis t corresponds to the starting of a thin film deposition process on a substrate 200 with already two thin film layers present. From left to right the thin film 500 grows to the desired thickness, as is illustrated by the different stadia 501, 502 and 503 of the substrate. For each time step a point is plotted in the diagram. A time step may e.g. correspond to a rotation period of the calotte carrying the substrates in an evaporator chamber, typically 0.5 seconds to 5 seconds. The thin film deposition was terminated at the last point indicated on the right end of the sequence of numerical criteria. The predefined condition was fulfilled at this time. In this case the predefined condition was: there are two successive numerical criteria in the sequence with increasing value. The sequence of numerical criteria has a minimum value at the third last time step. The desired spectrum provided for calculating the real number K being used as a numerical criterion may have been calculated for a layer thickness that is thinner by somewhat more than two time steps times the growth rate. This way, the intended layer thickness is nearly reached, when the transition through the minimum has been properly identified by two successive increases in the real number K being used as a numerical criterion. The remaining time for completion of the layer may than be calculated in order to exactly reach the intended layer thickness. The predefined condition for terminating the thin film deposition may as well involve fitting a polynomial through the last few points in the (t-K)—diagram, e.g. fitting a third order polynomial through the last ten points. The first derivative of the polynomial at the last time step may be used to detect an ascending slope. The occurrence of a minimum and its position in time may be identified in a more stable way from such a polynomial fit than from the raw data points. Neither the position in time of the minimum nor the ideal moment for termination of the deposition need to coincide with the time steps of the measurements. After identifying a minimum, the remaining time needed to complete the layer can be calculated. This remaining time may be a fraction of a time step. In summary, this method of controlling a thin film deposition process allows accurate layer termination based on the evaluation of optical spectra covering a wide spectral range.

LIST OF REFERENCE SIGNS 10 providing desired spectrum
20 measuring spectrum
21 illuminating substrate
22 receiving light
23 determining transmission or reflection spectrum
30 determining weight spectrum
40 calculating real number K
45 exploiting real number K as indication for a deviation of spectrum C from spectrum T
50 calculating signal spectrum and noise spectrum
200 substrate
201 evaporator chamber
202 calotte carrying substrates
203 optical receiver
204 optical path (in reflection)
205 optical sender (in reflection)
206 optical path (in transmission)
207 optical sender (in transmission)
208 evaporation sources
301, 302 regions in the wavelength range
303 peak in current spectrum
304 dip in weight spectrum
500 thin film
501, 502, 503 substrate with thin films in various stadia of a thin film deposition process
C current spectrum
K numerical criterion
N noise spectrum
P, P' previous spectra
R reflectance
S signal spectrum
T desired spectrum
t time
W weight spectrum
W0 initial weight spectrum
λ wavelength

What is claimed is:

1. A method of in situ monitoring a thin film deposition process on a substrate, the method comprising the steps of
   a) defining (10) a desired spectrum (T), said desired spectrum being a transmission or a reflection spectrum defined in a range of wavelengths;
   b) at least once:
      b1) illuminating (21) said substrate by means of a light source emitting light at least within said range of wavelengths,
      b2) receiving (22) light reflected from said substrate or transmitted through said substrate,
      b3) determining (23) at least one of a transmission and a reflection spectrum out of said received light within said range of wavelengths;
   c) defining a spectrum or a combination of spectra in dependency of said at least one spectrum determined in step b3) to be a current spectrum (C);
   d) determining (30) a weight spectrum (W) as a function of at least said current spectrum (C);
   e) calculating (40) a real number (K) as a function of said current spectrum (C), of said desired spectrum (T) and of said weight spectrum (W);
   f) exploiting (45) said real number (K) as indication for a deviation of said current spectrum (C) from said desired spectrum (T).

2. The method according to claim 1, wherein
   step b) is repeated at least twice to measure at least a previous spectrum and said current spectrum and wherein in step d)
      a signal spectrum S and a noise spectrum N are calculated as a function of said at least one previous spectrum and said current spectrum, and
      said weight spectrum W is calculated as a function of said signal spectrum S and said noise spectrum N.

3. The method according to claim 2, wherein said weight spectrum W is calculated as a ratio of said signal spectrum S and said noise spectrum N.

4. The method according to claim 1, wherein said real number K is calculated as $$K = \sum_i W(\lambda_i) \cdot (|C(\lambda_i) - T(\lambda_i)|)^n$$

wherein C is said current spectrum, T is said desired spectrum, W is said weight spectrum, $\lambda_i$ are the wavelengths at which the spectra are defined and n is a number.

5. The method according to claim 4, wherein n=1 or n=2.

6. The method according to claim 1, wherein the light source is a deuterium-halogen light source or a laser-driven light source.

7. A method of controlling a thin film deposition process on a substrate comprising the steps of
starting a thin film deposition process;
in a succession of time steps, applying the method according to claim 1 for producing said real number K for each time step thereby producing a sequence of numerical criteria;
terminating said thin film deposition process as soon as said sequence of numerical criteria fulfills a predefined condition.

8. The method according to claim 7, wherein said predefined condition is a transition of the sequence through a minimum.

9. A method of controlling a production of a multi-layer thin film on a substrate comprising the steps of:
providing a desired spectrum for at least one layer of said multi-layer thin film;
applying the method according to claim 7 to control the film deposition process for said at least one layer and/or for deposition of subsequent layers.

10. The method according to claim 9, comprising the additional step of recalculating layer thicknesses and layer compositions for layers to be deposited on top of said layer, the recalculation being based on said current spectrum and/or on the value of said real number at the moment said layer is completed.

11. The method according to claim 10, further comprising the step of calculating a desired spectrum for a layer stack comprising said layer and at least a further layer based on recalculated layer thicknesses and layer compositions.

* * * * *